(12) United States Patent
Tsukamoto

(10) Patent No.: US 7,777,280 B2
(45) Date of Patent: Aug. 17, 2010

(54) SEMICONDUCTOR DEVICE AND MANUFACTURING METHOD THEREOF

(75) Inventor: Kazuhiro Tsukamoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/263,130

(22) Filed: Oct. 31, 2008

(65) Prior Publication Data

US 2009/0108370 A1   Apr. 30, 2009

(30) Foreign Application Priority Data

Oct. 31, 2007   (JP) .............................. 2007-283028

(51) Int. Cl.
*H01L 27/092* (2006.01)
(52) U.S. Cl. .............................. 257/369; 257/E27.062
(58) Field of Classification Search ......... 257/369–371, 257/E27.062
See application file for complete search history.

(56) References Cited

U.S. PATENT DOCUMENTS

| | | | | |
|---|---|---|---|---|
| 7,378,713 B2* | 5/2008 | Hsu et al. | ......... | 257/369 |
| 7,432,567 B2* | 10/2008 | Doris et al. | ......... | 257/407 |
| 7,547,951 B2* | 6/2009 | Lim et al. | ......... | 257/410 |
| 7,625,791 B2* | 12/2009 | Tseng et al. | ......... | 438/199 |
| 2004/0180487 A1* | 9/2004 | Eppich et al. | ......... | 438/199 |
| 2005/0199963 A1* | 9/2005 | Aoyama | ......... | 257/369 |
| 2006/0011983 A1* | 1/2006 | Fitzgerald | ......... | 257/350 |
| 2006/0038239 A1* | 2/2006 | Tsuchiya et al. | ......... | 257/369 |
| 2006/0180870 A1* | 8/2006 | Ichihara et al. | ......... | 257/371 |
| 2007/0007602 A1* | 1/2007 | Oda et al. | ......... | 257/369 |
| 2007/0034964 A1* | 2/2007 | Park et al. | ......... | 257/369 |
| 2007/0148838 A1* | 6/2007 | Doris et al. | ......... | 438/197 |
| 2009/0298245 A1* | 12/2009 | Doris et al. | ......... | 438/216 |

FOREIGN PATENT DOCUMENTS

JP   2007-0193696   1/2007

* cited by examiner

*Primary Examiner*—Nathan W Ha
(74) *Attorney, Agent, or Firm*—McDermott Will & Emery LLP

(57) ABSTRACT

There have been provided a semiconductor device capable of preventing defects associated with etching, such as an increase in leak current, deterioration in film-coating properties and deterioration in transistor properties, and a method for manufacturing the semiconductor device. A CMOS transistor includes, on the same semiconductor substrate, an NMOS transistor having a gate electrode and a PMOS transistor having a gate electrode, wherein the former gate electrode includes a gate insulating film, a polycrystal silicon layer, a metal layer and another polycrystal silicon layer, and the latter gate electrode includes a gate insulating film, a metal layer and a polycrystal silicon layer.

15 Claims, 15 Drawing Sheets

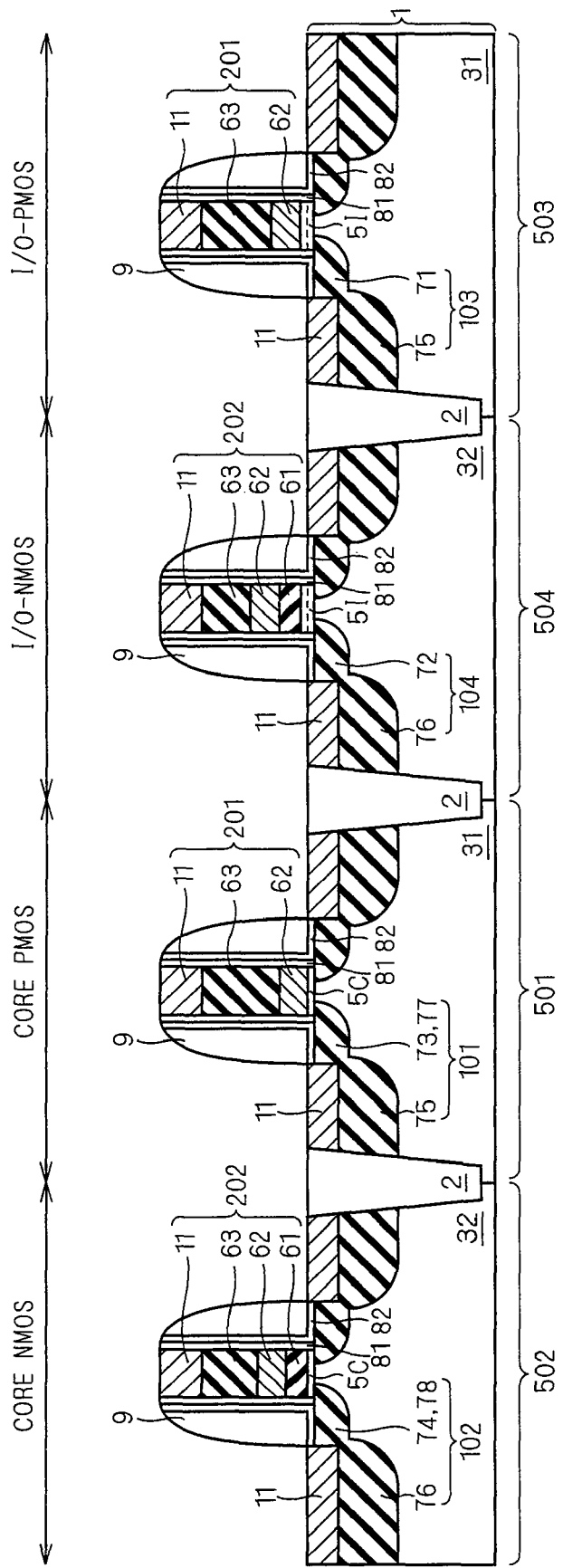

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and particularly relates to a technique for preventing defects associated with etching.

2. Description of the Background Art

Conventionally, semiconductor devices having a plurality of MOS configurations have been manufactured (e.g. Japanese Patent Application Laid-Open No 2007-19396). It is to be noted that in the present specification, the term MOS is broadly applied to a transistor using a material other than an oxide as a gate insulating film.

In the conventional semiconductor device manufacturing method, there have been two problems as described below.

The first problem is as follows. As shown in FIGS. 5 to 6 of Japanese Patent Application Laid-Open No 2007-19396, a metal layer 64 on the top of a P-type well 32 is selectively removed, and at this time, a problem occurs in which a gate insulating film 5 on the P-type well 32 is damaged and a leak current of the gate insulating film 5 thus increases. This is because part of the metal layer 64 and the gate insulating film 5 are reacted with each other to form an interfacial layer during the time between deposition and removal of the metal layer 64 and this interfacial layer is also removed in the removal of the metal layer 64.

The second problem is as follows. As shown in FIGS. 7 and 8 of Japanese Patent Application Laid-Open No 2007-19396, although simultaneous formation of a plurality of gate electrodes having different configurations is necessary, after etching of a polycrystal silicon layer 63, the metal layer 64 is exposed to the substrate surface in a PMOS and the gate insulating film 5 is exposed to the surface in an NMOS. In this state, for etching only the metal layer 64 without occurrence of penetration of the gate insulating film 5, the etching needs to be performed on condition of a large etching selection ratio of the metal to the gate insulating film. However, when the etching is performed with a large etching selection ratio of the metal to the gate insulating film, a side wall of the metal layer 64 cannot help but be formed into taper shape. Hence the film thickness of the insulating film, at the time of insulating film formation, becomes smaller at the lower end of the metal layer 64 having been formed into taper shape, thereby to cause deterioration in film-coating properties. Further, a problem occurs such as a problem in which injection into the transistor is affected by the taper of the metal layer, thereby to cause deterioration in transistor properties.

SUMMARY OF THE INVENTION

An object of the present invention is to provide a semiconductor device capable of preventing defects associated with etching, such as an increase in leak current, deterioration in film-coating properties and deterioration in transistor properties, and a method for manufacturing the semiconductor device.

A semiconductor device according to one embodiment of the present invention is a semiconductor device which includes, on the same semiconductor substrate, an NMOS transistor having a first gate electrode and a PMOS transistor having a second gate electrode. Further, in the semiconductor device according to one embodiment of the present invention, the first gate electrode includes: a first gate insulating film arranged on the semiconductor substrate; a first semiconductor layer arranged on the first gate insulating film; a first metallic material layer arranged on the first semiconductor layer; and a second semiconductor layer arranged on the first metallic material layer, and the second gate electrode includes: a second gate insulating film arranged on the semiconductor substrate; a second metallic material layer of the same kind as in the first gate electrode, arranged on the second gate insulating film; and a third semiconductor layer arranged on the second metallic material layer.

According to the semiconductor device according to one embodiment of the present invention, it is possible to prevent the problem of damaging the first gate insulating film on a P-type well associated with etching to increase a leak current of the first gate insulating film. Further, also in the case of etching the first and second metallic material layers and the first semiconductor layer after etching of the second semiconductor layer, it is possible to hold the side walls of the first and second metallic material layers and the first semiconductor layer in vertical shape, so as to prevent the problem of occurrence of deterioration in film-coating properties or deterioration in transistor properties. Namely, it is possible to prevent defects associated with etching.

A semiconductor device manufacturing method according to one embodiment of the present invention is a semiconductor device manufacturing method including, on the same semiconductor substrate, an NMOS region in which an NMOS transistor having a first gate electrode is arranged and a PMOS region in which a PMOS transistor having a second gate electrode is arranged. Further, a semiconductor device manufacturing method according to another embodiment includes the steps of: (a) forming a gate insulating film on the semiconductor substrate in the NMOS region and the PMOS region; (b) selectively forming a first semiconductor layer on the gate insulating film in the NMOS region after the step (a); (c) forming a metallic material layer over the whole main surface of the semiconductor substrate after the step (b); (d) forming a second semiconductor layer over the whole main surface of the semiconductor substrate after the step (c); and (e) performing patterning by etching after the step (d) to form a first gate electrode made up of the gate insulating film, the first semiconductor layer, the metallic material layer and the second semiconductor layer in the NMOS region, and a second gate electrode made up of the gate insulating film, the metallic material layer and the second semiconductor layer in the PMOS region.

According to the semiconductor device according to one embodiment of the present invention, it is possible to prevent the problem of damaging the first gate insulating film on a P-type well associated with etching to increase a leak current of the first gate insulating film. Further, also in the case of etching the first and second metallic material layers and the first semiconductor layer after etching of the second semiconductor layer, it is possible to hold the side walls of the first and second metallic material layers and the first semiconductor layer in vertical shape, so as to prevent the problem of occurrence of deterioration in film-coating properties or deterioration in transistor properties. Namely, it is possible to prevent defects associated with etching.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 to 15 are sectional views each showing a process in accordance with a method for manufacturing the CMOS transistor according to Embodiment 1.

DESCRIPTION OF THE PREFERRED EMBODIMENTS

Embodiment 1

Figure 1:
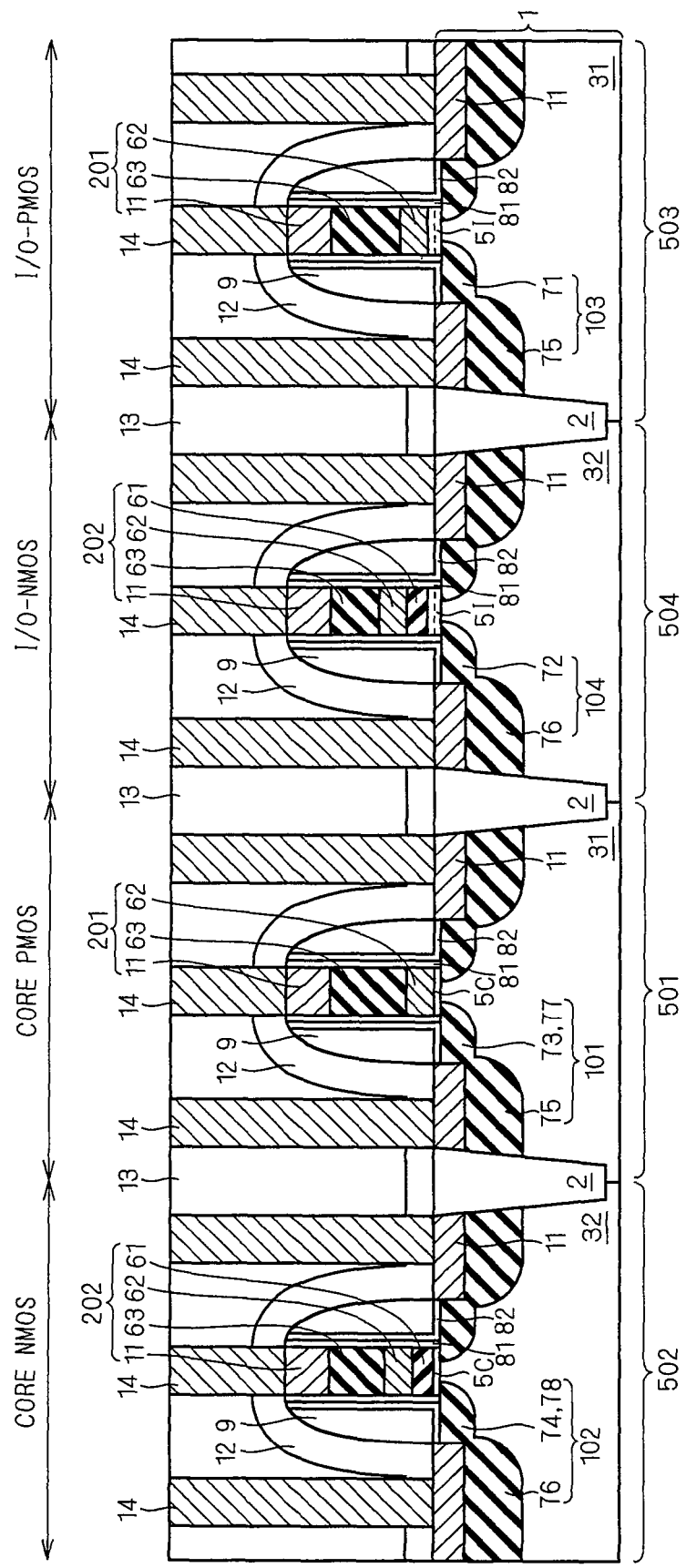
FIG. 1 is a sectional view showing a configuration of a CMOS transistor according to Embodiment 1.

FIG. 1 is a sectional view showing a CMOS transistor 500 according to Embodiment 1. The CMOS transistor 500 includes a core PMOS transistor 501, a core NMOS transistor 502, an I/O-PMOS transistor 503, and an I/O-NMOS transistor 504.

The I/O-PMOS transistor 503 and the I/O-NMOS transistor 504 are transistors that command an input/output of an external device, and are typically driven by a high power voltage as compared with the core PMOS transistor 501 and the core NMOS transistor 502 that command an internal circuit.

The core PMOS transistor 501 and the I/O-PMOS transistor 503 are provided in an N-type well 31, and the core NMOS transistor 502 and the I/O-NMOS transistor 504 are provided in a P-type well 32. The N-type well 31 and the P-type well 32 are provided on one main surface (upper side in FIG. 1) of the semiconductor substrate 1.

Further, the main surface sides of the N-type well 31 and the P-type well 32 are isolated from each other by a device isolation insulator 2. In other words, the device isolation insulator 2 isolates the PMOS region where the PMOS transistor is arranged and the NMOS region where the NMOS transistor is arranged, from each other.

To any of a semiconductor substrate 1, the N-type well 31 and the P-type well 32, silicon is for example adopted as a principal component. Also to other impurity layers, silicon can be adopted in the same manner as above unless otherwise noted. To the device isolation insulator 2, silicon oxide can for example be adopted.

The core PMOS transistor 501 has a gate electrode 201 and a pair of P-type source source/drain layer 101. In the N-type well 31, a region sandwiched by the pair of P-type source/drain layer 101 and facing the gate electrode 201 functions as a channel region of the core PMOS transistor 501.

The core NMOS transistor 502 has a gate electrode 202 and a pair of N-type source/drain layer 102. In the P-type well 32, a region sandwiched by the N-type source/drain layer 102 and facing the gate electrode 202 functions as a channel region of the core NMOS transistor 502.

The I/O-PMOS transistor 503 has the gate electrode 201 and a pair of P-type source/drain layer 103. In the N-type well 31, a region sandwiched by the pair of P-type source/drain layer 103 and facing the gate electrode 201 functions as a channel region of the I/O-PMOS transistor 503.

The I/O-NMOS transistor 504 has the gate electrode 202 and a pair of N-type source/drain layer 104. In the P-type well 32, a region sandwiched by the N-type source/drain layer 104 and facing the gate electrode 202 functions as a channel region of the I/O-NMOS transistor 504.

The P-type source/drain layer 101 includes a P-type main layer 75 and sub layers 73 and 77 whose bottoms are shallower than the bottom of the main layer 75 as seen from the main surface (the sub layers 73 and 77 are shown as the same layer for the sake of convenience of the drawing). The sub layer 73 is a P-type source/drain extension, and projects to the channel region side more than the main layer 75. The sub layer 77 is an N-type pocket, whose bottom is practically deeper than that of the sub layer 73 as seen from the main surface, and projects to the channel region side more than the sub layer 73.

The N-type source/drain layer 102 includes an N-type main layer 76 and sub layers 74 and 78 whose bottoms are shallower than the bottom of the main layer 76 as seen from the main surface (the sub layers 74 and 78 are shown as the same layer for the sake of convenience of the drawing). The sub layer 74 is an N-type source/drain extension, and projects to the channel region side more than the main layer 76. The sub layer 78 is a P-type pocket, whose bottom is practically deeper than that of the sub layer 74 as seen from the main surface, and projects to the channel region side more than the sub layer 74.

The P-type source/drain layer 103 includes the P-type main layer 75 and a sub layer 71 whose bottom is shallower than the bottom of the main layer 75 as seen from the main surface. The sub layer 71 is a P-type source/drain extension, and projects to the channel region side more than the main layer 75.

The N-type source/drain layer 104 includes the N-type main layer 76 and a sub layer 72 whose bottom is shallower than the bottom of the main layer 76 as seen from the main surface. The sub layer 72 is an N-type source/drain extension, and projects to the channel region side more than the main layer 76.

In any of the MOS transistors, an offset spacer 81, a side wall 82 having an L-shaped cross section, and a spacer 9 that fills a corner strip of the side wall 82 are provided around the gate electrode. An oxide film is for example adopted as a material for the offset spacer 81 and the side wall 82. A nitride film is for example adopted as a material for the spacer 9.

A liner insulating film 12 and an interlayer insulating film 13 are provided on the device isolation insulator 2, the sub layers (source/drain extensions) 71 to 74, the offset spacer 81, the side wall 82, the spacer 9, and the gate electrode 201 and 202. A nitride film is adopted as a material for the liner insulating film 12. An oxide film is for example adopted as a material for the interlayer insulating film 13.

A contact plug 14 is provided so as to penetrate the liner insulating film 12 and the interlayer insulating film 13. At a position of the lower end (the main surface side) of the contact plug 14, a silicide layer 11 is formed in the sub layers (source-drain extensions) 71 to 74 and the gate electrodes 201 and 202. Through this silicide layer 11, the sub layers (source/drain extensions) 71 to 74 and the gate electrodes 201 and 202 are electrically connected with the contact plug 14. The silicide layer 11 is constituted for example of cobalt silicide. It is to be noted that the silicide layer 11 is desirably provided from the view point of making electric connection favorable, but is not essentially provided. Further, a metal may can be adopted as a material for the contact plug 14.

The core PMOS transistor 501 has a gate insulating film 5C between the gate electrode 201 and the N-type well 31. The core NMOS transistor 502 has the gate insulating film 5C between the gate electrode 202 and the P-type well 32. The I/O-PMOS transistor 503 has a gate insulating film 5I having a larger thickness than that of the gate insulating film 5C between the gate electrode 201 and the N-type well 31. The I/O-NMOS transistor 504 has the gate insulating film 5I having a larger thickness than that of the gate insulating film 5C between the gate electrode 202 and the P-type well 32. In the following, each of the gate insulating films 5C and 5I is generically named simply as a gate insulating film 5.

As a material for the gate insulating film 5 adopted can be, other than oxide silicon, hafnium oxide ($HfO_2$) having a high dielectric constant, hafnium oxides such as hafnium silicon oxide ($Hf_xSi_yO_z$) and hafnium aluminum oxide ($Hf_xAl_yO_z$), and hafnium silicon nitride oxide.

The gate electrode 201 includes a metal layer 62, a polycrystal silicon layer 63, and the suicide layer 11 in this order from the gate insulating film 5 side. Further, the gate electrode 202 includes a polycrystal silicon layer 61, the metal layer 62, the polycrystal silicon layer 63, and the silicide layer 11 on this order from the gate insulating film 5 side. It should be noted that the metal layer 62 has a thickness not smaller than 3 nm.

In a typical CMOS transistor, in the case of adopting polycrystal silicon as the gate electrode, the conductive type of the gate electrode is normally made different between the PMOS transistor and the NMOS transistor. This is due to the need for adjustment of a mutual threshold in the PMOS transistor and the NMOS transistor.

However, in the present embodiment, the polycrystal silicon layer 63 faces the channel region with not only the gate insulating film 5 but also at least the metal layer 62, having a thickness not smaller than 3 nm, interposed. Therefore, the conductive type of the polycrystal silicon layer 63 does not immediately determine thresholds of the core PMOS transistor 501 and the I/O-PMOS transistor 503. Accordingly, in the present embodiment, the polycrystal silicon layer 63 of the same kind is used in common in the gate electrodes 201 and 202, to reduce the number of manufacturing processes.

On the other hand, since the polycrystal silicon layer 61 faces the channel region with only the gate insulating film 5 interposed in the gate electrode 202, the conductive type of the polycrystal silicon layer 61 is desirably the N-type. Naturally, since the metal layer 62 faces the channel layer with only the gate insulating film 5 interposed in the gate electrode 201, it is desirable to adopt, as a material for the metal layer 62, a metal having a work function suitable for each of the core PMOS transistor 501 and the I/O-PMOS transistor 503. In the case of adopting silicon as a principal component of the N-type well 31, the metal desirably has a work function close to a valence band of silicon (the range of ±0.3 eV with 5.15 eV set at the center, namely 5.12 to 5.18 eV).

Examples of the material having such a work function may include metals such as Pt, Ir, Rn, Re, Os, Ti, Ru and Mo, and metal compounds such as TiN, TaN, HfC, MoN, and Ruo.

FIGS. 2 to 15 are sectional views sequentially showing respective processes according to a method for manufacturing the CMOS transistor 500 in FIG. 1.

Figure 2:
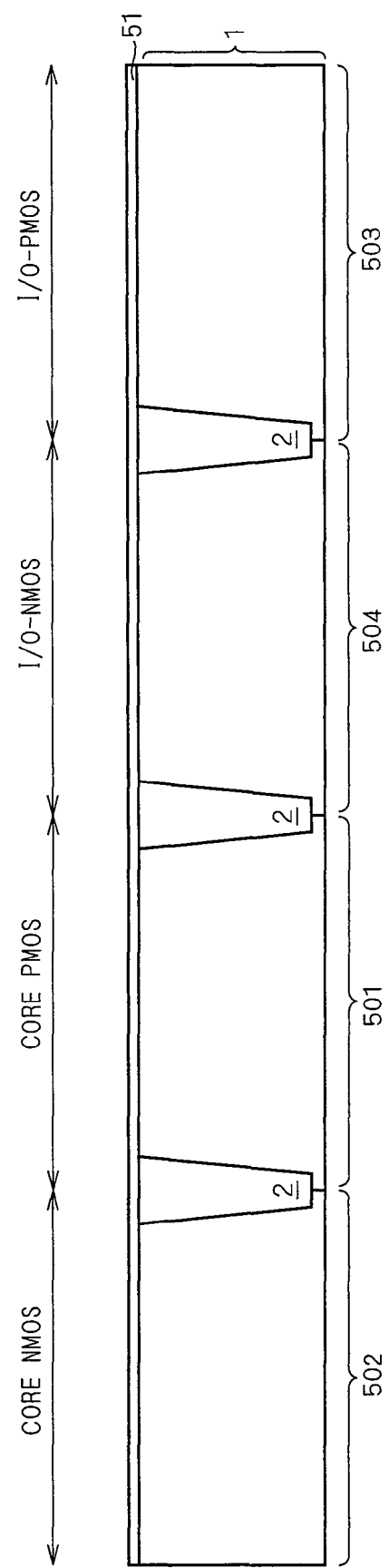

First, with reference to FIG. 2, a plurality of device isolation insulators 2 are provided, while isolated from one another, on the one main surface of the semiconductor substrate 1. The STI (Shallow Trench Isolation) method is for example adopted to formation of the device isolation insulator 2. An oxide film 51 for injection is then formed on the main surface.

Figure 3:
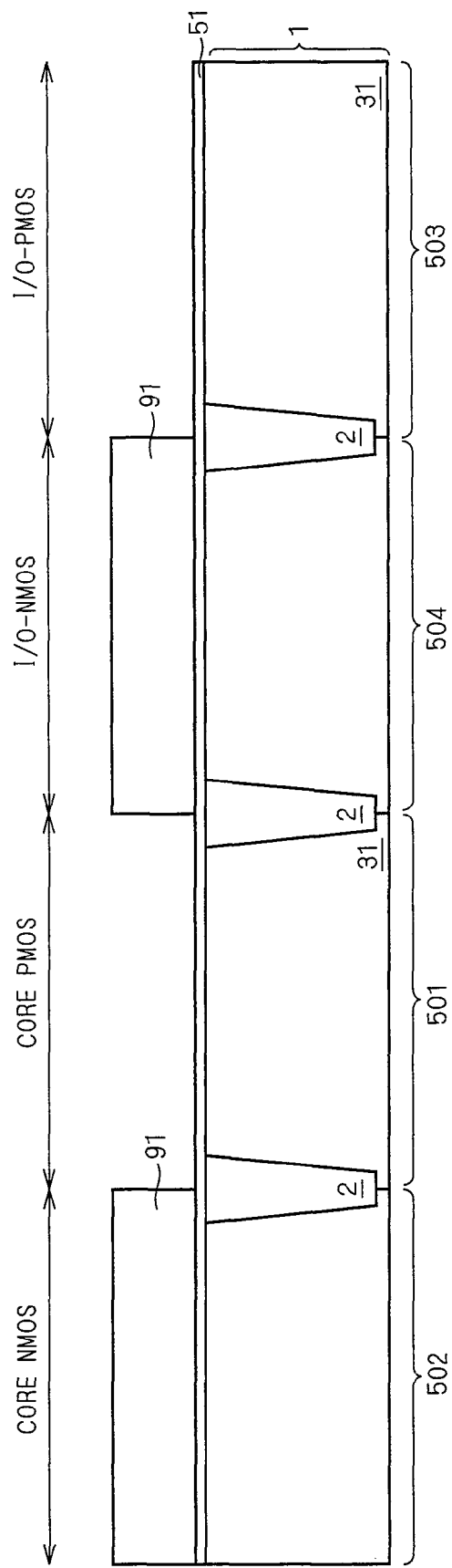

Next, with reference to FIG. 3, in a region where the NMOS transistor will be formed later (NMOS region), a photoresist 91 is formed on the main surface.

Subsequently, using the photoresist 91 as a mask, an N-type impurity is introduced to the main surface through the oxide film 51 for injection. Phosphorus can for example be adopted as the N-type impurity to be injected. Injection of the N-type impurity leads to formation of the N-type well 31. Thereafter, the photoresist 91 is removed. It is to be noted that the N-type well 31 of the core PMOS transistor 501 and the N-type well 31 of the I/O-PMOS transistor 503 may be formed by simultaneous injection, or may be formed by separate injection with different injection amounts.

Figure 4:
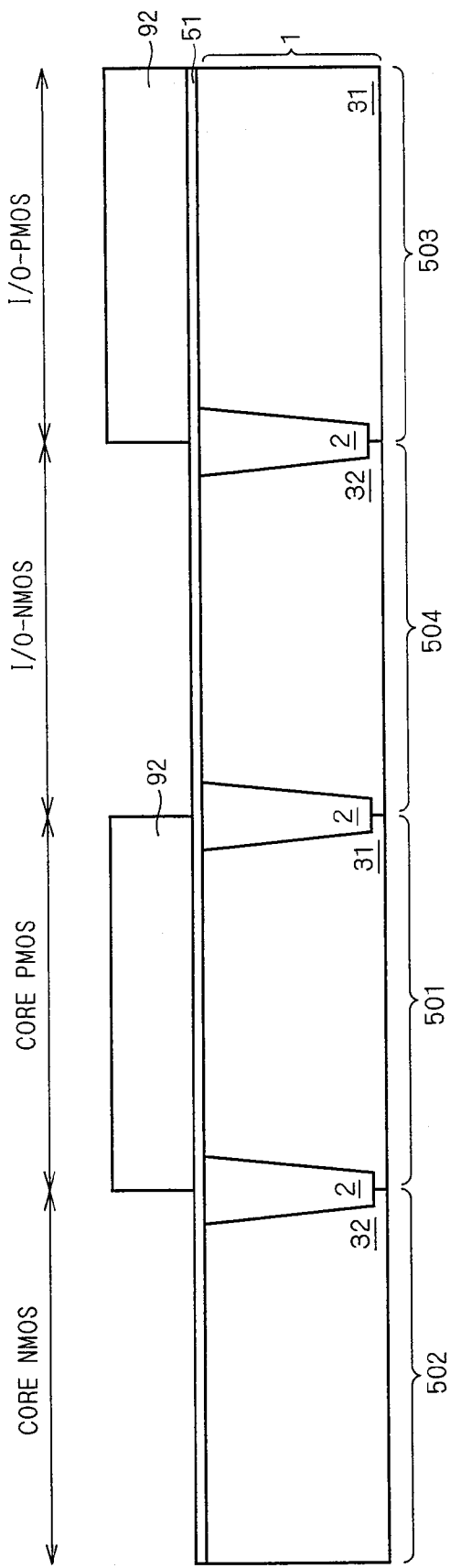

Next, with reference to FIG. 4, in a region where the PMOS transistor will be formed later (PMOS region), a photoresist 92 is formed on the main surface.

Subsequently, using the photoresist 92 as a mask, a P-type impurity is introduced to the main surface through the oxide film 51 for injection. Boron can be adopted as the P-type impurity to be injected. Injection of the P-type impurity leads to formation of the P-type well 32. Thereafter, the photoresist 92 is removed. It is to be noted that the P-type well 32 of the core NMOS transistor 502 and the P-type well 32 of the I/O-PMOS transistor 504 may be formed by simultaneous injection, or may be formed by separate injection with different injection amounts.

Figure 5:
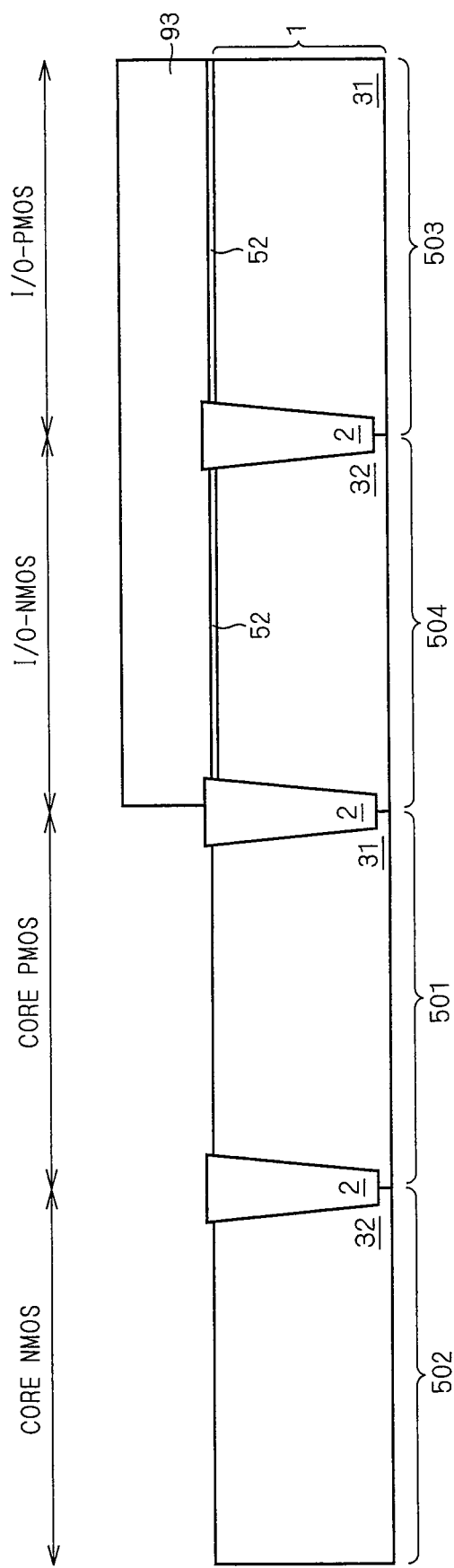

Next, with reference to FIG. 5, on the main surface, the oxide film 51 for injection is removed and a gate insulating film 52 is formed for example of oxide silicon. Then, a photoresist 93 is formed in a region (I/O-MOS region) where the I/O-PMOS transistor 503 and the I/O-NMOS transistor 504 will be formed later, and the gate insulating film 52 is selectively removed using the photoresist 93 as a mask. It is thereby possible to selectively leave the gate insulating film 52 in the region (I/O-MOS region) where the I/O-PMOS transistor 503 and the I/O-NMOS transistor 504 will be formed later.

Figure 6:
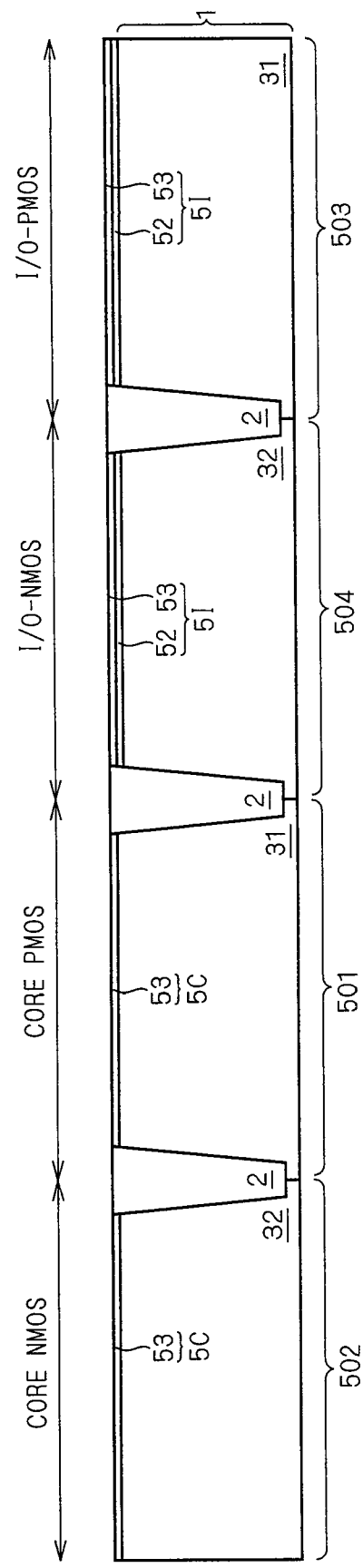

Next, with reference to FIG. 6, on the main surface, a gate insulating film 53 is formed of hafnium oxide or hafnium silicon nitride oxide. Thereby, the gate insulating film 5I having a double layer configuration consisting of the gate insulating films 52 and 53 is formed in the I/O-MOS region, and the gate insulating film 5C having a single layer configuration consisting of the gate insulating film 53 is formed in the core MOS region.

Figure 7:
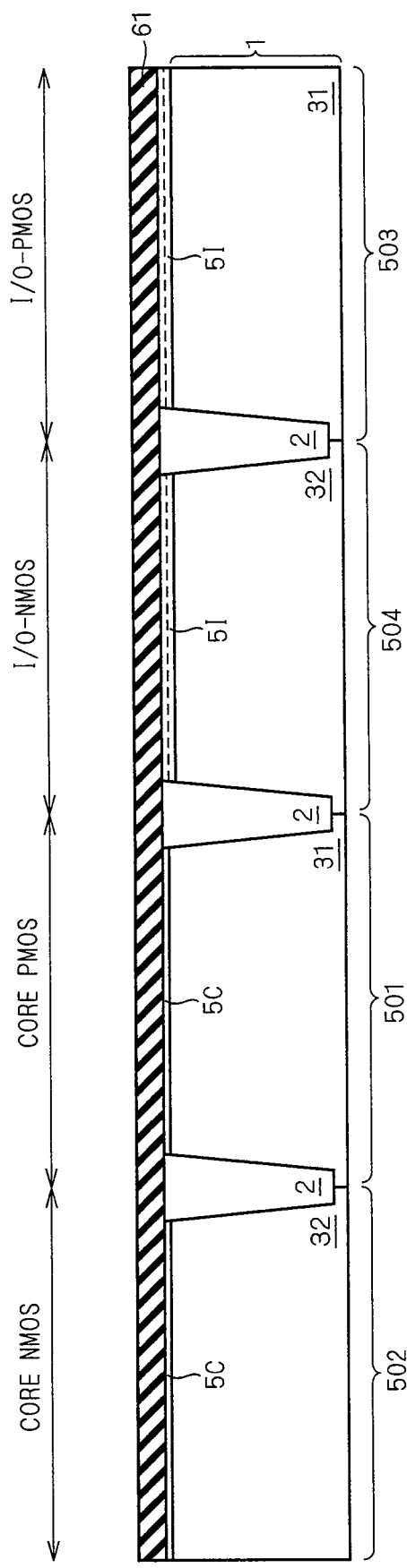

Next, with reference to FIG. 7, the polycrystal silicon layer 61 having a thickness of 5 to 20 nm is formed over the whole surface exposed on the main surface side.

It should to be noted that for forming the polycrystal silicon layer 61 with its conductive type being the N-type, it is desirable to form the polycrystal silicon layer 61 while introducing the N-type impurity (e.g. phosphorous) thereinto. It is also possible to form the polycrystal silicon layer 61 with its conductive type being the N-type by previously forming the polycrystal silicon layer 61 and then injecting the N-type impurity from the surface of the polycrystal silicon layer 61. However, occurrence of a depletion layer on the gate insulating film 5 side of the gate electrodes 201 and 202 can be reduced more in the case of forming the polycrystal silicon layer 61 while introducing the N-type impurity thereinto than in the case of injecting the ion up to the vicinity of the gate insulating film 5.

Figure 8:
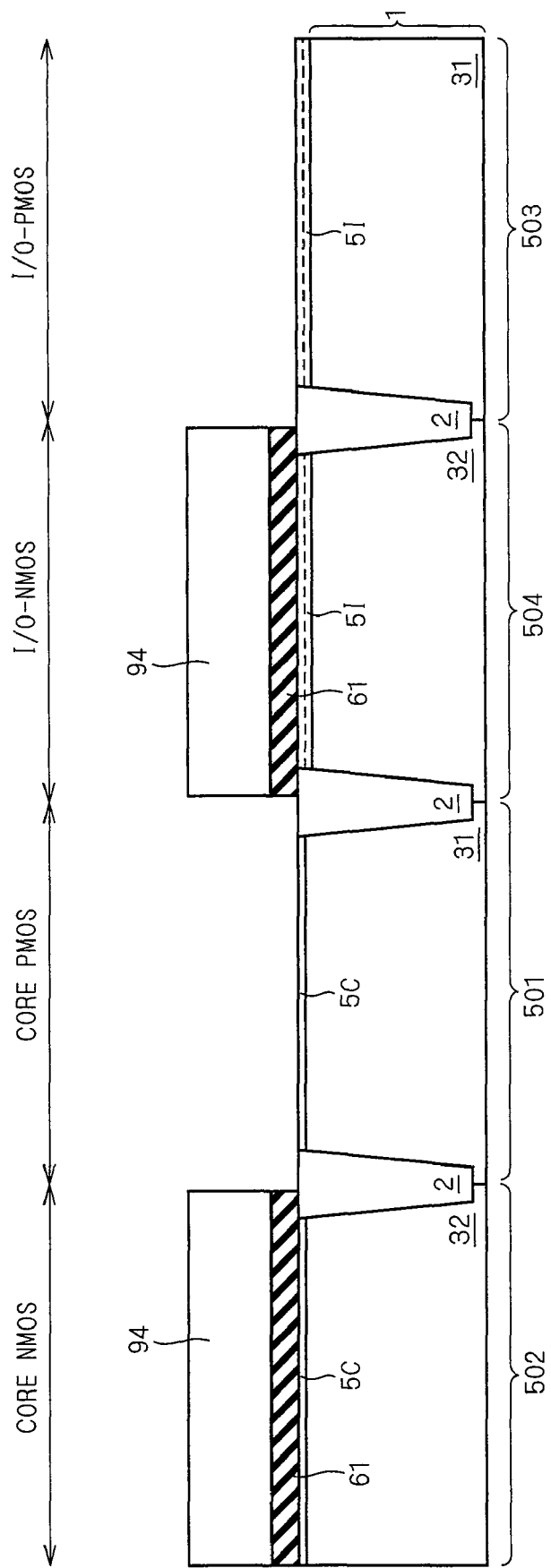

Next, with reference to FIG. 8, a photoresist 94 is formed on the P-type well 32, and using the photoresist 94 as a mask, the polycrystal silicon layer 61 on the N-type well 31 is selectively removed.

Figure 9:
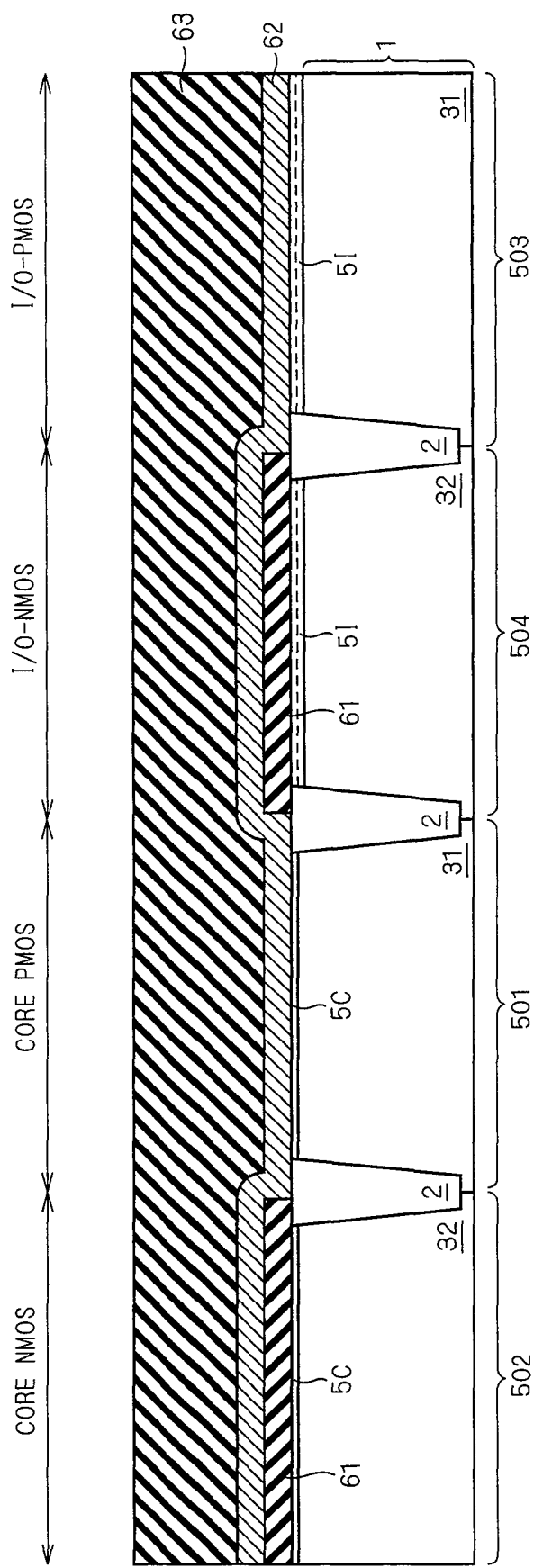

Next, with reference to FIG. 9, the metal layer 62 having a thickness of not smaller than 3 nm is formed over the whole surface exposed on the main surface side, and subsequently, the polycrystal silicon layer 63 is formed. TiN produced by CVD (Chemical Vapor Deposition) is for example applied to the metal layer 62.

Thereby, a laminated-layer film is formed, of the metal layer 62 and the polycrystal silicon layer 63 on the gate insulating film 5 on the top of the N-type well 31, namely in the PMOS region, and a laminated-layer film is formed of the polycrystal silicon layer 61, the metal layer 62 and the polycrystal silicon layer 63 on the gate insulating film 5 on the P-well 32, namely in the NMOS region.

It is to be noted that for forming the polycrystal silicon layer 63 with its conductive type being the N-type, it is desirable to form the polycrystal silicon layer 61 while introducing the N-type impurity (e.g. phosphorous) thereinto.

Figure 10:
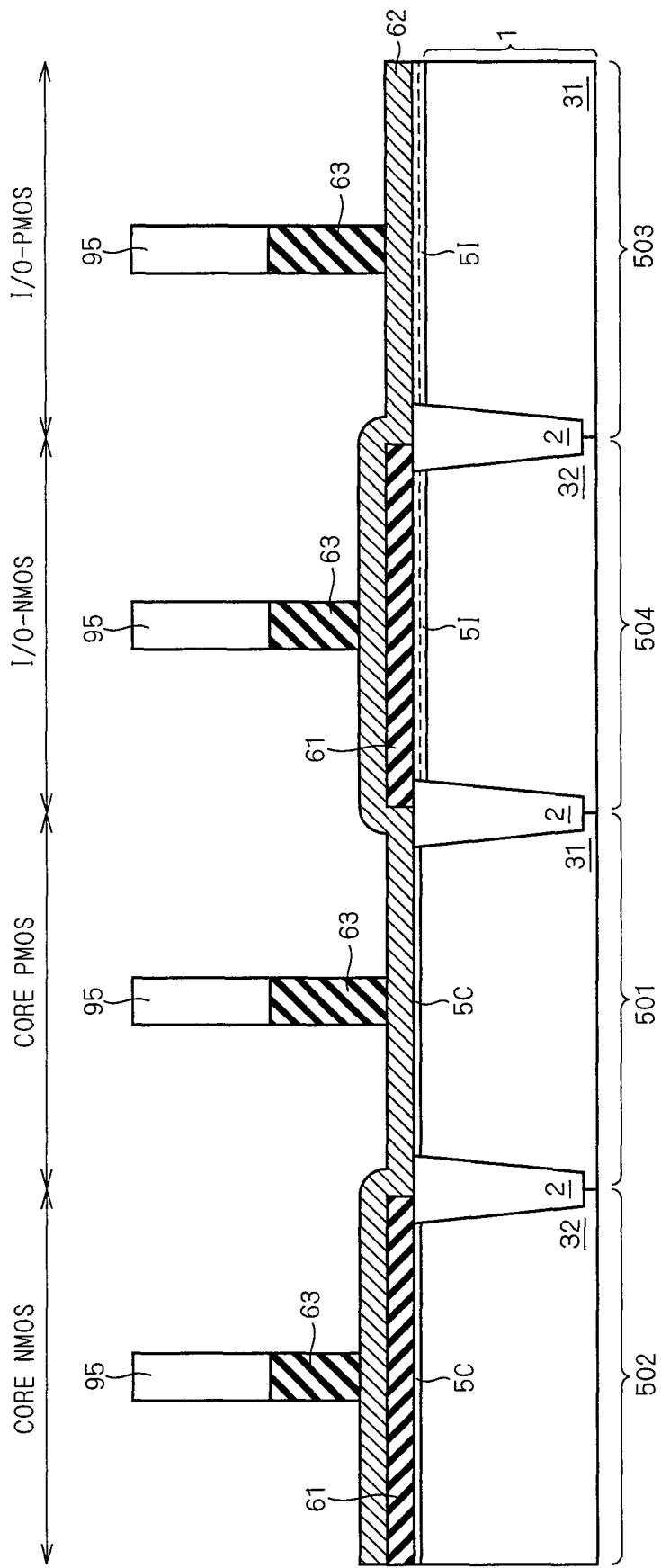

Next, with reference to FIG. 10, a photoresist 95 having a prescribed pattern for gate electrode patterning is formed on the polycrystal silicon layer 63. Then, using the photoresist 95 as a mask, the polycrystal silicon layer 63 is etched until the whole surface of the metal layer 62 is exposed.

Figure 11:
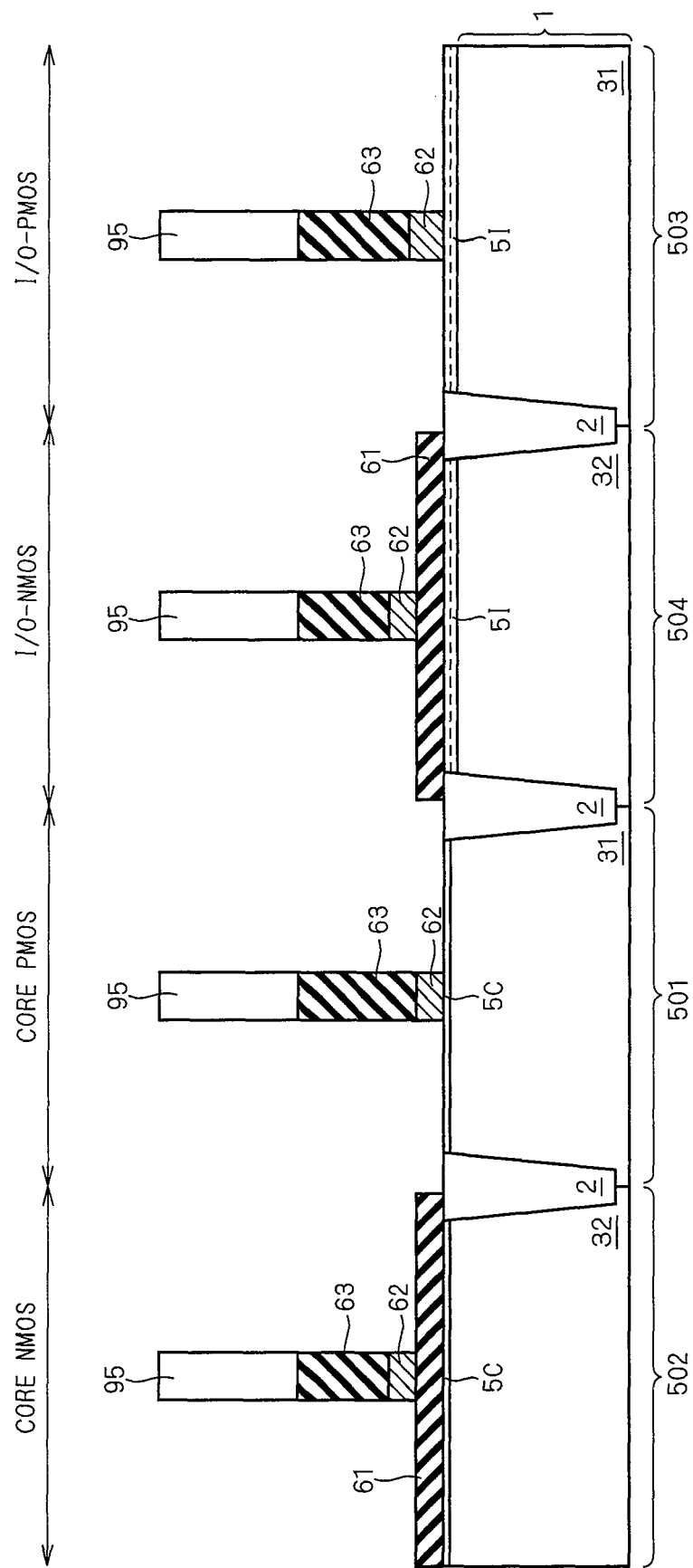

Next, with reference to FIG. 11, using the photoresist 95 as the mask, the metal layer 62 on the N-type well 31 and the metal layer 62 on the P-type well 32 are simultaneously etched. Since the metal layer 62 in the PMOS region and in the NMOS region can be simultaneously etched, the side wall of the metal layer 62 can be held in vertical shape without being formed into taper shape.

Figure 12:
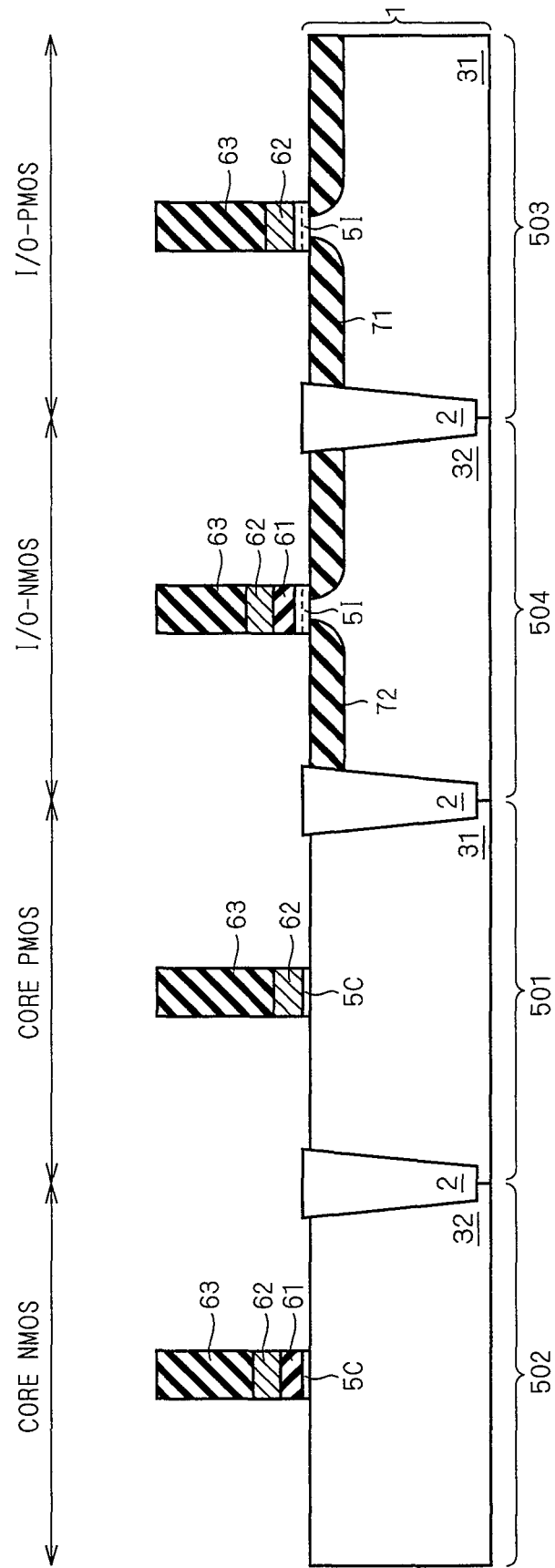

Next, with reference to FIG. 12, the polycrystal silicon layer 61 on the P-type well 32 is further etched using the photoresist 95 as the mask. Differently from Japanese Patent Application Laid-Open No 2007-19396, in etching the polycrystal silicon layer 61, it is not necessary to perform etching with a large etching selection ratio of the metal to the gate insulating film for preventing penetration of the gate insulating film 5 in the NMOS region. Therefore, the side wall of the polycrystal silicon layer 61 can be held in vertical shape without being formed into taper shape. Namely, it is possible to respectively hold the side walls of the gate electrode 201 and the gate electrode 202 in vertical shape on the N-type well 31 and the P-type well 32.

Subsequently, the sub layer (source-drain extension) 71 of the I/O-PMOS transistor 503 is formed. Further, the sub layer (source-drain extension) 72 of the I/O-NMOS transistor 504 is formed.

Although not shown in detail, in forming the sub layer (source-drain extension) 71, the photoresist is applied and then selectively removed only in the I/O-PMOS transistor 503, and the P-type impurity (e.g. boron) is introduced into the N-type well 31 by ion injection.

Similarly, in forming the sub layer (source-drain extension) 72, the photoresist is applied and then selectively removed only in the I/O-NMOS transistor 504, and the N-type impurity (e.g. phosphorous) is introduced into the P-type well 32 by ion injection.

Figure 13:
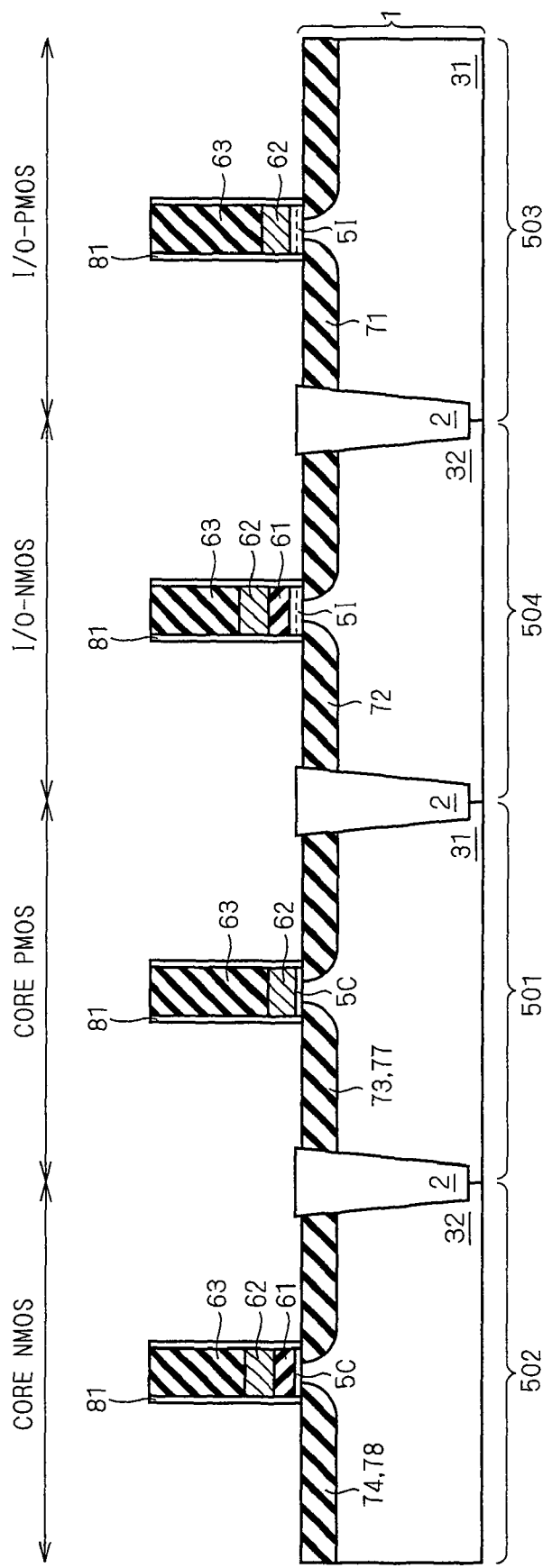

Next, with reference to FIG. 13, an insulating film is deposited over the whole surface of the semiconductor substrate 1, and the whole surface of the insulating film is then etched back, to form the offset spacer 81.

Subsequently, the sub layer (source-drain extension) 73 of the core PMOS transistor 501 is formed. Further, the sub layer (source-drain extension) 74 of the core NMOS transistor 502 is formed.

Although not shown in detail, in forming the sub layer (source-drain extension) 73, the photoresist is applied and then selectively removed only in the core PMOS transistor 501, and the P-type impurity (e.g. boron) is introduced into the N-type well 31 by ion injection. Further, for suppressing a short-channel effect, the N-type impurity (e.g. phosphorous) is ion-injected at a slant to the main surface, to form a sub layer (pocket) 77.

Similarly, in forming the sub layer (source-drain extension) 74, the photoresist is applied and then selectively removed only in the core NMOS transistor 502, and the N-type impurity (e.g. phosphorous) is introduced into the P-type well 32 by ion injection. Further, for suppressing the short-channel effect, the P-type impurity (e.g. boron) is ion-injected at a slant to the main surface, to form a sub layer (pocket) 78.

It should be noted that respective dosed amounts and injected energy in these ion injection are determined based upon depths and resistance values required for the sub layers (source/drain extensions) 73 and 74 and the sub layers (pockets) 77 and 78.

Figure 14:
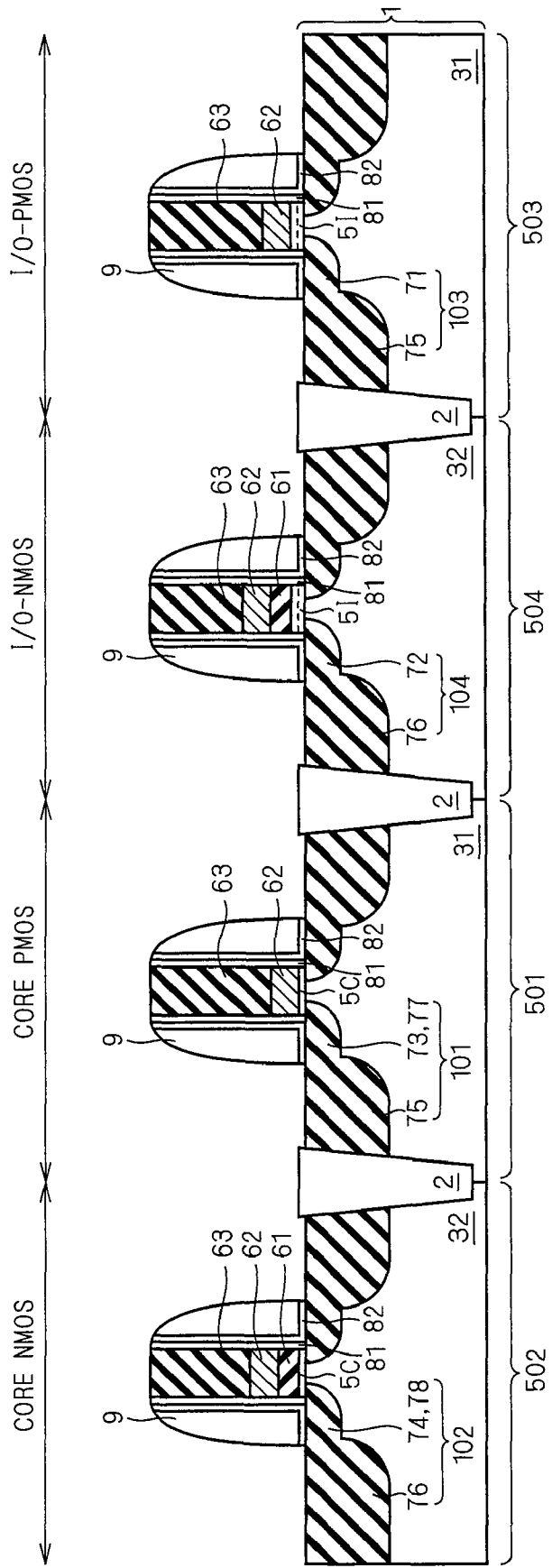

Next, with reference to FIG. 14, an oxide film and a nitride film are formed on this order over the whole exposed surface on the main surface side, and the oxide film and the nitride film are then etched back, to form the side wall 82 made of the oxide film and the spacer 9 made of the nitride film.

Subsequently, on the top of the N-type well 31, namely in the PMOS region, the main layer 75 is formed using, as a mask, a laminated-layer configuration of the polycrystal silicon layer 63, the metal layer 62 and the gate insulating film 5, the offset spacer 81 around the configuration, the side wall 82, and the spacer 9.

Further, on the top of the P-type well 32, namely in the NMOS region, the main layer 76 is formed using, as a mask, a laminated-layer configuration of the polycrystal silicon layer 63, the metal layer 62, the includes, on the same semiconductor substrate 1, the NMOS having the gate electrode 202 (first gate electrode) and the PMOS transistor having the gate electrode 201 (second gate electrode), wherein the gate electrode 202 includes: the gate insulating film 5 (first gate insulating film) arranged on the semiconductor substrate 1; the polycrystal silicon layer 61 (first semiconductor layer) arranged on the gate insulating film 5; the metal layer 62 (metallic material layer) arranged on the polycrystal silicon layer 61; and the polycrystal silicon layer 63 (second semiconductor layer) arranged on the metal layer 62, and the gate electrode 201 includes: the gate insulating film 5 (second gate insulating film) arranged on the semiconductor substrate 1; the metal layer 62 arranged on the gate insulating film 5; and the polycrystal silicon layer 63 (third semiconductor layer) arranged on the metal layer 62.

Therefore, differently from Japanese Patent Application Laid-Open No 2007-19396, it is not necessary to remove the metal layer 62 of the gate electrode 202 in the NMOS transistor. It is therefore possible to prevent the problem of damaging the gate insulating film 5 on the P-type well 32 to increase a leak current of the gate insulating film 5.

Further, differently from Japanese Patent Application Laid-Open No 2007-19396, even when the metal layer 62 and the metal layer 62 are etched after etching of the polycrystal silicon layer 63, the side walls of the metal layer 62 and the polycrystal silicon layer 63 can be held in vertical shape. It is therefore possible to prevent the problem of occurrence of deterioration in film-coating properties and deterioration in transistor properties.

Namely, according to the semiconductor device and manufacturing method thereof in accordance with the present embodiment, it is possible to polycrystal silicon layer 61 and the gate insulating film 5, the offset spacer 81 around the configuration, the side wall 82, and the spacer 9.

Although not shown in detail, in forming the main layer 75, the top of the P-type well 32 is covered by a photoresist, and the P-type impurity (e.g. boron) is introduced by ion injection into the N-type well 31 including the sub layers 71, 73 and 77.

Similarly, in forming the main layer 76, the top of the N-type well 31 is covered by a photoresist, and the N-type impurity (e.g. phosphorous) is introduced by ion injection into the P-type well 32 including the sub layers 72, 74 and 78.

Subsequently, annealing is performed for activating the P-type source/drain layers 101 and 103, and the N-type source/drain layer 102 and 104. Lamp annealing is for example adopted to the annealing.

A metal for silicide, e.g. cobalt, is formed over the whole exposed surface on the main surface side, and first silicification is performed by annealing. The metal for silicide which was not reacted is removed, and second silicification is performed by further annealing, to prompt phase transition of silicide so as to reduce resistance of silicide. Thereby, as shown in FIG. 15, the silicide layer 11 is formed on the exposed surfaces of the sub layers (source/drain extensions) 71 to 74 and the polycrystal silicon layer 63.

By a known manufacturing process, the liner insulating film 12, the interlayer insulating film 13 and the contact plug 14 are formed, to obtain the CMOS transistor 500 which is shown in FIG. 1.

As thus described, the semiconductor device according to the present embodiment is the CMOS transistor 500 (semiconductor device) which prevent defects associated with etching.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device which comprises, on the same semiconductor substrate, an NMOS transistor having a first gate electrode and a PMOS transistor having a second gate electrode, wherein
    said first gate electrode includes:
    a first gate insulating film arranged on said semiconductor substrate;
    a first semiconductor layer arranged on said first gate insulating film;
    a first metallic material layer arranged on said first semiconductor layer; and
    a second semiconductor layer arranged on said first metallic material layer, and
    said second gate electrode includes:
    a second gate insulating film arranged on said semiconductor substrate;
    a second metallic material layer of the same kind as in said first gate electrode, arranged on and in touch with said second gate insulating film; and
    a third semiconductor layer arranged on said second metallic material layer.

2. The semiconductor device according to claim 1, wherein said second semiconductor layer and said third semiconductor layer consist of the same kind of semiconductor layer.

3. The semiconductor device according to claim 1, wherein said first and second metallic material layers have a thickness of not smaller than 3 nm.

4. The semiconductor device according to claim 1, wherein said first semiconductor layer is made of silicon whose conductivity type is an n type, and a work function of said first metallic material layer is in the range of 5.12 to 5.18 eV.

5. The semiconductor device according to claim 1, wherein said first and second metallic material layers are made of Pt, Ir, Rn, Re, Os, Ti, Ru, or Mo.

6. The semiconductor device according to claim 1, wherein said first and second metallic material layers are made of TiN, TaN, HfC, MoN, or RuO.

7. The semiconductor device according to claim 1, wherein said first and second gate insulating films are made of hafnium oxide.

8. The semiconductor device according to claim 1, wherein said first and second gate insulating films are made of hafnium silicon nitride oxide.

9. The semiconductor device according to claim 1, wherein the first semiconductor layer is arranged on and in touch with said first gate insulating film.

10. The semiconductor device according to claim 9, wherein said first metallic material layer is arranged on and in touch with the first semiconductor layer, said second semiconductor layer is arranged on and in touch with said first metallic material layer, and said third semiconductor layer is arranged on and in touch with said second metallic material layer.

11. The semiconductor device according to claim 1, wherein said second and third insulating layers include polycrystal silicon layers.

12. The semiconductor device according to claim 1, wherein said first to third semiconductor layers include polycrystal silicon layers each having n-type impurities.

13. A semiconductor device which comprises, on the same semiconductor substrate, an NMOS transistor having a first gate electrode and a PMOS transistor having a second gate electrode, wherein said first gate electrode includes:
    a first gate insulating film arranged on said semiconductor substrate;
    a first semiconductor layer of polycrystal silicon arranged on said first gate insulating film;
    a first metallic material layer arranged on said first semiconductor layer, and
    a second semiconductor layer of polycrystal silicon arranged on said first metallic material layer, and said second gate electrode includes:
    a second gate insulating film arranged on said semiconductor substrate;
    a second metallic material layer of the same kind as in said first gate electrode, arranged on said second gate insulating film; and
    a third semiconductor layer of polycrystal silicon arranged on said second metallic material layer.

14. The semiconductor device according to claim 13, wherein each of said first and second gate insulating films has hafnium elements and oxygen elements.

15. The semiconductor device according to claim 13, wherein said first to third semiconductor layers have n-type impurities.

* * * * *